(12) United States Patent
Das

(10) Patent No.: US 11,994,548 B2
(45) Date of Patent: May 28, 2024

(54) RF PEAK DETECTOR CIRCUIT

(71) Applicant: TEXAS INSTRUMENTS INCORPORATED, Dallas, TX (US)

(72) Inventor: Arnab Das, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 281 days.

(21) Appl. No.: 17/512,552

(22) Filed: Oct. 27, 2021

(65) Prior Publication Data

US 2023/0128266 A1 Apr. 27, 2023

(51) Int. Cl.
G01R 29/08 (2006.01)
H03F 3/193 (2006.01)
H03G 3/30 (2006.01)

(52) U.S. Cl.
CPC ......... *G01R 29/0878* (2013.01); *H03F 3/193* (2013.01); *H03G 3/3036* (2013.01); *H03F 2200/435* (2013.01); *H03F 2200/451* (2013.01); *H03G 2201/103* (2013.01)

(58) Field of Classification Search
CPC .................. G01R 29/0878; H03F 3/193; H03F 2200/435; H03F 2200/451; H03F 2200/294; H03F 3/19; H03F 3/45399; H03F 3/45735; H03G 3/3036; H03G 2201/103; H03G 3/3084; H03G 2201/206
USPC ......................................................... 324/130
See application file for complete search history.

(56) References Cited

U.S. PATENT DOCUMENTS

| | | | | |
|---|---|---|---|---|
| 4,613,769 A | * | 9/1986 | Gross | G01R 19/04 327/58 |
| 7,013,117 B2 | * | 3/2006 | Darabi | H04B 1/406 375/345 |
| 7,426,376 B2 | * | 9/2008 | Srinivasan | H04B 1/109 455/252.1 |
| 7,486,114 B2 | * | 2/2009 | Chen | H04L 25/0274 327/20 |

(Continued)

FOREIGN PATENT DOCUMENTS

| | | |
|---|---|---|
| CN | 103297005 A | 9/2013 |
| CN | 112782466 A | 5/2021 |
| CN | 112986669 A | 6/2021 |

OTHER PUBLICATIONS

European Patent Office, Application 22203829.1-1205, dated Mar. 16, 2023, 11 pages.

(Continued)

*Primary Examiner* — Christopher P McAndrew
(74) *Attorney, Agent, or Firm* — Michael T. Gabrik; Frank D. Cimino

(57) ABSTRACT

An apparatus comprises a transistor pair including a first metal oxide semiconductor field effect transistor (MOSFET) coupled to a second MOSFET. The first MOSFET includes a first gate terminal and a first drain terminal. The second MOSFET comprises a second gate terminal and a second drain terminal. The first gate terminal is configured to receive a first signal. The second gate terminal is configured to receive a second signal that is phase shifted with respect to the first signal. An output node is coupled to the first drain terminal and the second drain terminal and configured to output a third signal that is proportional to a power of the first signal and the second signal.

20 Claims, 5 Drawing Sheets

(56) References Cited

U.S. PATENT DOCUMENTS

| | | | | |
|---|---|---|---|---|
| 8,854,130 B2* | 10/2014 | Coban | ............... | H03F 1/223 |
| | | | | 330/140 |
| 8,948,717 B2* | 2/2015 | Winoto | ............ | H03G 3/3068 |
| | | | | 455/226.2 |
| 10,425,071 B2* | 9/2019 | Karmaker | ......... | H03K 5/153 |
| 2009/0262784 A1* | 10/2009 | Ikeda | ............. | H03D 7/1458 |
| | | | | 327/359 |
| 2012/0034895 A1* | 2/2012 | Xuechu | ............ | H03K 5/1532 |
| | | | | 455/341 |
| 2013/0082688 A1* | 4/2013 | Horvath | ............ | G01R 21/01 |
| | | | | 327/356 |
| 2013/0342274 A1* | 12/2013 | Coban | ............... | H03F 1/223 |
| | | | | 330/252 |
| 2014/0187185 A1* | 7/2014 | Winoto | ............ | H04B 17/21 |
| | | | | 455/226.1 |
| 2018/0131356 A1 | 5/2018 | Karmaker | | |
| 2021/0083639 A1* | 3/2021 | Parthasarathy | ...... | H03G 3/3068 |
| 2021/0159861 A1 | 5/2021 | Leung et al. | | |

OTHER PUBLICATIONS

Hao Hu et al.: "A single ended input wideband variable gain low noise amplifier with balanced differential output and digital AGC for CMMB TV tuner", Integrated Circuits, ISIC '09. Proceedings of the 2009 12th International Symposium on, IEEE, Piscataway, NJ, USA, Dec. 14, 2009 (Dec. 14, 2009), pp. 393-396, XP031622681, ISBN: 978-981-08-2468-6.

* cited by examiner

RF PEAK DETECTOR CIRCUIT

BACKGROUND

Peak detectors, which are also referred to as signal level detectors, power detectors, or envelope detectors, are widely used in wireless transceivers. Peak detectors (hereinafter "PDETs") may be used to obtain signal power levels of sinusoidal radio frequency (RF) signals that are received at an antenna of a wireless transceiver. PDETs are commonly implemented using transistors. Transistors have a non-linear voltage and current relationship. A small-signal voltage is an alternating current (AC) voltage signal (e.g., a time-varying voltage signal) where the amplitude of the small-signal is small (e.g., in milli-volts or micro-volts) relative to direct current (DC) bias voltages (e.g., in volts) that are applied to bias the transistors in the PDET. A non-linear voltage and current relationship during small-signal operation can be represented with first-order and higher-order drain currents as a function of the small-signal gate-to-source voltage ($V_{gs}$). For instance, a small-signal drain current $i_d$ is modeled as a sum of a linear current source $gmV_{gs}$, and non-linear current sources, for example, $gm_2V_{gs}^2$, $gm_3V_{gs}^3$, and higher-order non-linear current sources. The value gm is a first-order linear transconductance coefficient, $gm_2$ is a second-order non-linear transconductance coefficient, $gm_3$ is a third-order non-linear transconductance coefficient, etc. Using the transistor non-linearity, a PDET can detect the power of a received alternating current (AC) signal as direct current (DC) voltage from the non-linear currents. The DC voltage is the power level of the received signal.

SUMMARY

In accordance with at least one example of the disclosure, a system for detecting power of a signal comprises an antenna configured to send a first signal, an amplifier coupled to the antenna to receive the first signal and configured to provide a second signal based on the first signal, a peak detector coupled to the amplifier, and an automatic gain-control (AGC) circuit coupled to the peak detector and the amplifier. The peak detector includes a transistor pair, a first input node, a second input node, and an output node. The peak detector includes a first metal oxide semiconductor field effect transistor (MOSFET) comprising a first gate terminal, a first drain terminal, and a first source terminal, and a second MOSFET coupled to the first MOSFET and includes a second gate terminal, a second drain terminal, and a second source terminal. The second drain terminal is coupled to the first drain terminal, and the second source terminal is coupled to the first source terminal. The first input node is coupled to the first gate terminal and configured to receive the second signal, the second input node is coupled to the second gate terminal and configured to receive a third signal that is phase shifted with respect to the second signal, and the first output node coupled to the first drain terminal and the second drain terminal and configured to output a fourth signal that is proportional to a power of the first signal and the second signal. The AGC circuit is coupled to the first output node and to the amplifier and is configured to provide a gain control signal to the LNA based on the fourth signal.

In accordance with another example of the disclosure, an apparatus comprises a transistor pair including a first MOSFET and a second MOSFET. The first MOSFET includes a first gate terminal and a first drain terminal. The second MOSFET is coupled to the first MOSFET and comprises a second gate terminal and a second drain terminal. A first input node is coupled to the first gate terminal and configured to receive a first signal. A second input node is coupled to the second gate terminal and configured to receive a second signal that is phase shifted with respect to the first signal. An output node is coupled to the first drain terminal and the second drain terminal and configured to output a third signal that is proportional to the first signal and the second signal. In accordance with another example of the disclosure, A system comprises an antenna configured to send a first signal, an amplifier coupled to the antenna to receive the first signal and configured provide a second signal based on the first signal, a mixer coupled to the amplifier to receive the second signal and configured to provide a third signal based on the second signal, a filter coupled to the mixer to receive the third signal and configured to provide a fourth signal based on the third signal, an analog-to-digital converter (ADC) coupled to the filter and configured to provide a fifth signal based on the fourth signal, a peak detector coupled to the amplifier to receive the second signal and configured to provide a sixth signal based on the second signal, a comparator coupled to the peak detector to receive the sixth signal and configured to output a trigger signal based on a comparison of a threshold signal with the sixth signal, and an automatic gain-control (AGC) circuit coupled to the comparator and to the amplifier, wherein the AGC circuit is configured to provide a gain control signal to the LNA based on the trigger signal.

BRIEF DESCRIPTION OF THE DRAWINGS

For a detailed description of various examples, reference will now be made to the accompanying drawings in which.

DETAILED DESCRIPTION

Figure 1:
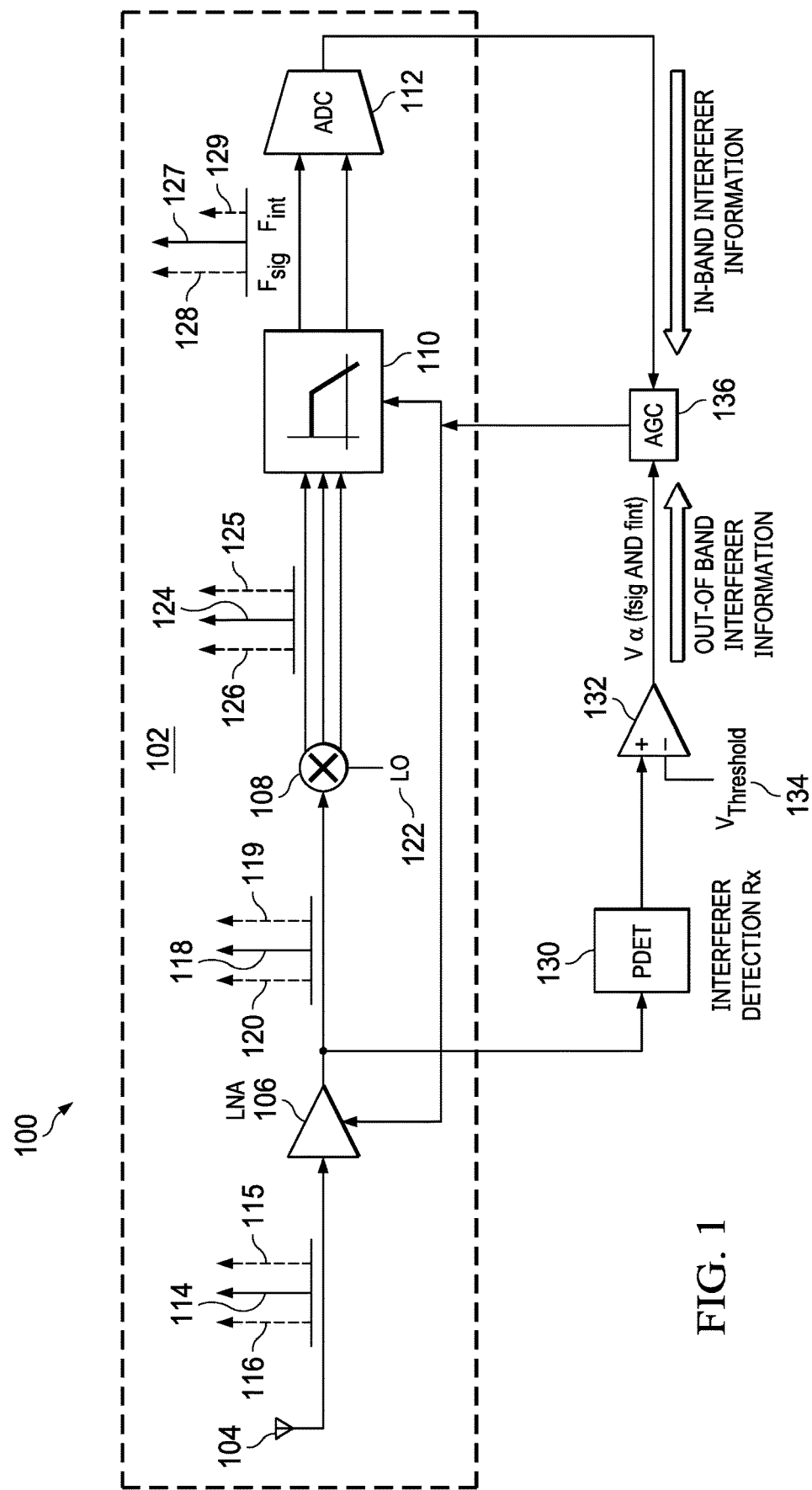
FIG. 1 is a block diagram of a receiver circuit with a peak detector in accordance with various examples.

Information in the form of AC components (e.g., RF signals) in an otherwise DC voltage that is obtained by a PDET can be used in automatic gain-control (AGC) circuits to adjust the gain of low-noise amplifiers (LNA) in the wireless transceiver. However, interferer/blocker signals can also be received at the LNA. These interferer signals are in-band interference signals from other communication systems or out-of-band interference signals on a neighboring channel in the same communication system. These interferer signals, if not suppressed at an input of the LNA, can affect the linear operation of the LNA by causing the LNA to saturate (e.g., operating in the saturation region). When an interferer signal causes the LNA to go into saturation, a control signal from an AGC may be used to adjust the gain of the LNA in order to move the operating point of LNA into a linear region of operation. However, during the time the LNA is saturated, information that was received at the LNA can be corrupted and not retrievable. PDETs can detect the interferer signal. However, during detection, these PDETs also attenuate the power of the desired RF signal when the desired RF signal is at a lower amplitude. Attenuating the desired RF signal impacts the detection sensitivity of the PDET to detect weak interferer signals relative to the desired RF signal (e.g., around 15 decibel (dB) to 20 dB lower than the RF power of the desired RF signal). Interferer signals can impact linearity, signal-to-noise ratio (SNR), and other performance measures of an LNA and a mixer in a receiver chain of a wireless communication system. Thus, weak interferer signals relative to the desired RF signal cannot be detected using PDETs, while strong interferer signals relative to the desired RF signal (e.g., within 5 dB of the RF power of the desired RF signal) are detected. Further, some PDETs use a common-drain topology, where second-order non-linear drain currents are combined as they exit source terminals of the transistors in these PDETs. The impedance looking into the source node is 1/gm, and the small-signal gain Av of the PDET is obtained at the source node and is $(-gm_2/gm)*Vgs^2$. This small-signal gain Av makes it difficult to detect relatively weak interferer signals relative to the desired RF signal.

Disclosed herein are examples of a PDET arranged in a common-source topology that detects the power of relatively weak interferer RF signals relative to the desired RF signal (e.g., within 15 dB to 20 dB of the RF power of the desired RF signal) without degrading performance measures of an LNA and a mixer in a receiver chain. In an example, the detected interferer power is provided to an AGC circuit in order to adjust the gain of an LNA and thereby move the LNA operating point from the saturation region to a linear region of operation. In an example, the PDET uses a differential interferer RF signal that is applied to a differential pair of transistors. In another example, the power of an interferer RF signal is detected using second-order non-linear drain currents of transistors. In an example, the second-order non-linear drain currents are obtained by combining the non-linear drain currents at the drain terminals of the transistors in the PDET. The second-order non-linear drain currents provide a DC value (e.g., $A^2/2$) and AC current value ($(A^2/2)\sin(2\omega t)$), where A is the amplitude. The DC value is proportional to the power of the interferer RF signal. In at least one example, the small-signal drain currents, looking into the drain terminal, experience a resistance of load resistor R in parallel with a drain-to-source resistance $r_{ds}$ (e.g., $R \| r_{ds}$). Resistance $r_{ds}$ is larger than 1/gm in metal oxide semiconductor field effect transistors (MOSFETS). A small-signal voltage gain Av of the MOSFET for drain currents is a function of load resistance of resistor R and second-order non-linear drain currents $gm_2 V_{gs}^2$. The small-signal gain Av of PDET is $-gm_2*Vgs^2*((r_{ds}*R)/(r_{ds}+R))$, which is high. In an example, the small-signal gain of PDET is around 13 dB higher than the small-signal voltage gain Av of conventional PDETs. The higher small-signal gain of the PDET can detect weaker interferer RF signals than conventional PDETs without degrading the performance of an LNA. Further, the PDET improves small-signal voltage gain Av without increasing the power dissipation over conventional PDETs.

FIG. 1 is a block diagram of a wireless receiver (RX) circuit 100 that includes a PDET in accordance with various examples. In an example, the wireless RX circuit 100 uses a PDET to detect signal strength (e.g., signal power) of an interferer RF signal. The PDET uses the signal power of the interferer RF signal to determine a signal value that is provided to an AGC circuit in order to control the voltage gain of the LNA and move the LNA out of saturation into a linear mode of operation. In some examples, the wireless RX circuit 100 is used in wireless local area network (LAN) receivers for WIFI, BLUETOOTH, and other wireless applications such as in television receivers, cellular phones, modems, network devices, wireless radios, or the like.

As shown in FIG. 1, wireless RX circuit 100 includes an RX chain 102 for processing an RF signal that is received by the wireless RX circuit 100. The RX chain 102 includes antenna 104, LNA 106, mixer 108, filter 110, and analog-to-digital converter (ADC) 112. Antenna 104 is coupled to an input of LNA 106. An output of LNA 106 is coupled to an input of mixer 108. An output of mixer 108 is coupled to an input of filter 110. An output of filter 110 is coupled to an input of ADC 112. A first input of AGC 136 is coupled to an output of ADC 112, a second input of AGC 136 is coupled to an output of comparator 132, and an output of AGC 136 is coupled to LNA 106 and filter 110. An output of LNA 106 is coupled to an input of PDET 130. The input of PDET 130 and the input of the mixer 108 receive a signal from the output of LNA 106 as a differential. An output node of PDET 130 is coupled to a first input of comparator 132. A second input of comparator 132 receives a threshold voltage value 134.

In operation, the antenna 104 provides wirelessly-transmitted AC signals (e.g., RF signals) to the LNA 106. In an example, the antenna 104 may provide in-band interferer RF signals, out-of-band interferer RF signals, or both in-band and out-of-band interferer signals as a multi-tone RF signal to the LNA 106 if wireless RX circuit 100 is near an access point of a communication system. A multi-tone RF signal is composed of multiple single sine waves or tones with a unique amplitude, phase and frequency. In an example, antenna 104 provides a desired RF signal component 114, an in-band interferer RF signal component 115, and out-of-band interferer RF signal component 116. In an example, antenna 104 provides a multi-tone RF signal comprising an RF signal component 114 with a frequency of 2.401 Gigahertz (GHz), an in-band interferer RF signal component 115 with a frequency of 2.37 GHz, and an out-of-band interferer RF signal component 116 with a frequency of 2.3 GHz.

In an example, the LNA 106 includes an amplifier and a single-ended-to-differential converter to generate differential signals after amplification of the multi-tone RF signal. In an example, the differential signal includes a positive multi-tone RF signal and a negative multi-tone RF signal with each multi-tone RF signal comprising RF signal components. LNA 106 amplifies RF signals 114, 115, and 116 in order to increase the amplitude of RF signal components 114, 115, and 116 such that the SNR of the RF signal components 114, 115, and 116 is increased. In an example, LNA 106 amplifies the RF signal component 114 to produce a higher-amplitude RF signal component 118, amplifies the interferer RF signal component 115 to produce a higher-amplitude RF interferer signal component 119, and amplifies the interferer RF signal component 116 to produce a higher-amplitude RF interferer signal component 120 at its output. In an example, the LNA 106 generates the RF signal component 118, interferer RF signal component 119, and interferer RF signal component 120 as components of a differential signal. While not shown in the figures for clarity, it is understood that circuit components downstream of the LNA 106 processes differential multi-tone signals that are produced by the LNA 106.

Mixer 108 is coupled to LNA 106 and filter 110. Mixer 108 receives a local oscillator (LO) signal 122 from a LO (not shown), and also receives the differential signals from the LNA 106. In an example, the LO signal 122 is a large-signal voltage signal that has a frequency of 2.4 GHz. However, in examples, the frequency of LO signal 122 is varied as the frequency of RF signal component 118 varies. The mixer 108 down converts the frequency of RF signal component 118, RF interferer signal component 119, and RF interferer signal component 120 in the differential signals using the LO signal 122 to lower-frequency intermediate frequency (IF) multi-tone IF signal with IF signal components. In an example, the mixer 108 multiplies the LO signal 122 with the output RF signal component 118 to obtain an IF signal component 124, multiplies the LO signal 122 with RF interferer signal component 119 to obtain an IF signal component 125, and multiplies the LO signal 122 with RF interferer signal component 120 to obtain interferer IF signal component 126. In an example where RF signal component 118 is 2.401 GHz, RF interferer signal component 120 is 2.3 GHz (e.g., out of band interferer signal), and the LO signal is 2.4 GHz, the frequencies of IF signal components 124 and 126 may be 1 megahertz (MHz) and 100 MHz, respectively, and IF signal component 126 is an out-of-band IF signal. For RF signal component 118 at a frequency of 2.401 GHz and RF interferer signal component 119 at a frequency of 2.37 GHz (e.g., in-band interferer signal), the frequencies of IF signal components 124 and 125 are 1 MHz and 30 MHz, respectively, and IF signal component 125 is an in-band IF signal component.

Filter 110 is an IF filter that receives the multi-tone IF signal comprising IF signal components 124, 125, and 126. Filter 110 has a bandwidth to attenuate out-of-band signals. Therefore, filter 110 provides an output signal that includes an IF signal 127 that corresponds to IF signal 124. In an example where IF signal 126 is an out-of-band interferer signal, filter 110 attenuates IF signal component 126 to produce an output signal with a substantially lower amplitude interferer IF signal component 129 corresponding to signal component 126. However, in an example where IF signal component 126 is an in-band interferer, filter 110 produces an output signal that includes a relatively unfiltered IF signal component 128 corresponding to IF signal component 126. Accordingly, the output of filter 110 includes a multi-tone IF signal that includes a desired IF signal component 127, interferer IF signal component 128, and lower amplitude interferer IF signal component 129. The desired IF signal component 127 and interferer IF signal component 128 are inputted into ADC 112, which converts desired IF signal component 127 and interferer IF signal component 129 to digital signals for processing.

In at least one example, interferer RF signal component 116 (e.g., out-of-band interferer RF signal component) is at a high-power and saturates the LNA 106 and mixer 108 (e.g., corrupts the RX chain 102). In some such examples, when interferer RF signal component 116 has similar strength/power as RF signal component 114, the combined RF signal components 114 and 116 can cause the LNA 106 to operate in the saturation region thereby reducing the gain of the LNA 106. In at least one example, amplifying interferer RF signal component 116 at LNA 106 produces RF interferer signal component 120 at the output of LNA 106 that is also amplified. In an example, RF interferer signal component 120, which is amplified, causes the mixer 108 to operate in the saturation region. In an example, if LNA 106 and mixer 108 are saturated, filter 110 cannot filter out the interferer IF signal component 126 as interferer RF signal component 116 is at a high-power and reduces the sensitivity of LNA 106 and mixer 108 (e.g., corrupts RX chain 102). In order to prevent interferer RF signal component 116, being at a high-power, from corrupting RX chain 102, in at least one example, wireless RX circuit 100 includes feedback paths that provide interferer signal information to AGC 136 in order to control a gain of LNA 106.

In a first feedback path from ADC 112 to AGC 136 to LNA 106 and filter 110, interferer IF signal component 126, which is an out-of-band interferer signal component, is filtered by filter 110. As interferer IF signal component 126 is outside the cut-off frequency (e.g., passband) of filter 110 which, in an example, is 10 MHz, the power of interferer IF signal component 126 is attenuated by filter 110 and is provided as interferer IF signal component 129. As filter 110 filters interferer IF signal component 126 to reduce its RF power, ADC 112 will not sense this interferer IF signal component 129 at its input. In another example, if interferer IF signal component 126 is an in-band interferer IF signal component (e.g., is at a 30 MHz frequency), the interferer IF signal component 129, which corresponds to interferer IF signal component 126, is detected by ADC 112. In an example, ADC 112 senses power of input signals into ADC 112 including interferer IF signal component 126. As interferer IF signal component 126 falls within passband of filter 110, interferer IF signal component 126 is not filtered out and is sensed by ADC 112. In an example, ADC 112 obtains the strength (e.g., RF power) of interferer IF signal component 126, which is sent to AGC 136. AGC 136 uses the strength of interferer IF signal component 129 to provide a gain control signal for adjusting the gain (e.g., increase the gain or decrease the gain) of LNA 106 so that LNA 106 operates in a linear region of operation.

In a second feedback path from PDET 130 to AGC 136, interferer RF signal component 116 is an out-of-band interferer signal component (e.g., interferer IF signal component 116 has a frequency of 2.3 GHz) and has a similar strength as RF signal component 114, which can saturate the LNA 106. In an example, PDET 130 receives, from the LNA 106, the differential signal of the multi-tone RF signal comprising RF signal component 118, RF interferer signal component 119, and RF interferer signal component 120. In an example, PDET 130 detects the power of the multi-tone RF signal, which includes power of the RF signal component 118, power of the interferer RF signal component 119, and power of the interferer RF signal component 120. The power of the interferer RF signal component 119 can be ignored in this particular example as it is of a smaller strength than the interferer RF signal component 120 and the RF signal component 118. In an example, PDET 130 outputs a voltage value (e.g., an analog value) representing the power of the multi-tone RF signal. The output is provided to comparator 132. In an example, comparator 132 compares the analog voltage value of the output from the PDET 130 with a threshold voltage value 134. The threshold voltage value 134 may be a user-defined threshold voltage value. If the analog voltage value of the PDET 130 is greater than the threshold voltage value 134, comparator 132 provides a triggering signal to AGC 136 indicating a high-power interferer RF signal component 120. In at least one example, AGC 136 is configured to provide a gain control signal to the LNA 106 for adjusting the gain (e.g., increase or decrease the gain) of the LNA 106 when receiving the triggering signal in order to operate the LNA 106 in the linear region.

Figure 2A:
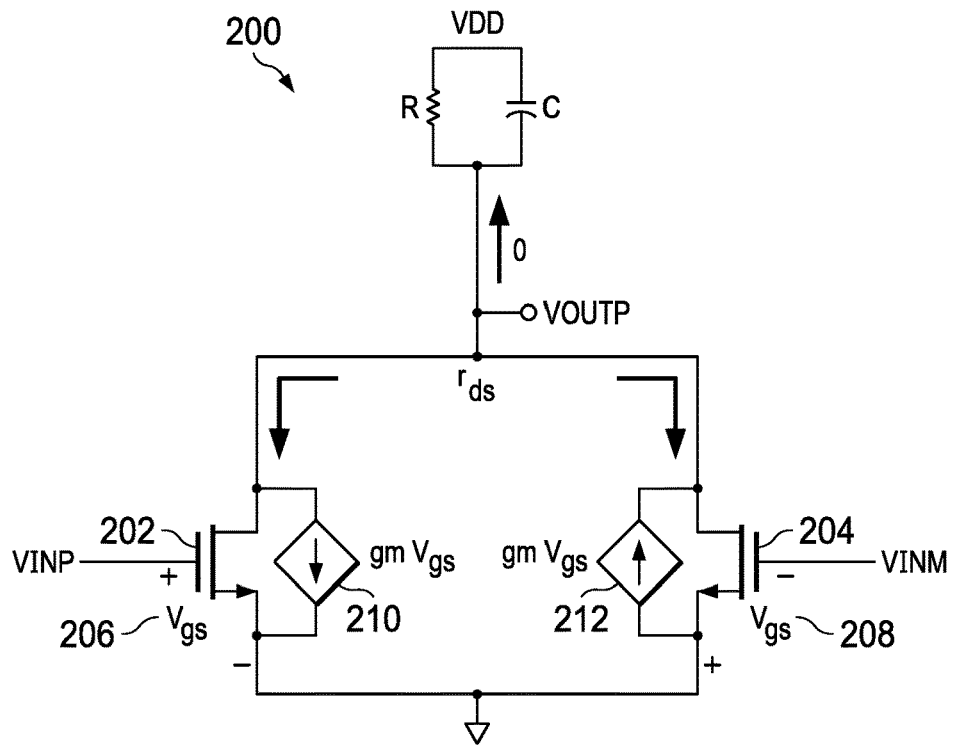
FIG. 2A is a circuit diagram of a peak detector circuit in accordance with various examples.
Figure 2B:
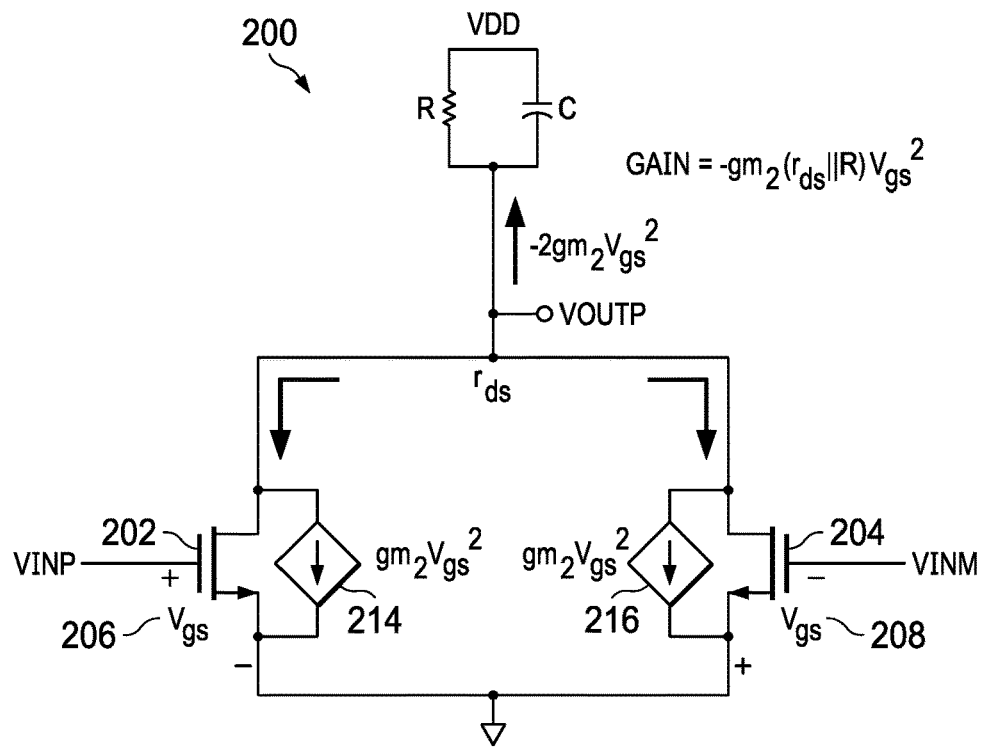
FIG. 2B is a circuit diagram of a peak detector circuit in accordance with various examples.

FIGS. 2A and 2B illustrate a portion of an AC equivalent circuit of a PDET circuit 200 that is used to detect power of an interferer RF signal using small-signal linear and non-linear drain currents of PDET circuit 200 in accordance with various examples. In particular FIG. 2A is annotated to show first order effects of a signal applied to the PDET circuit 200, and FIG. 2B is annotated to show second-order effects of the signal applied to the PDET circuit 200. In an example, PDET circuit 200 uses the second-order non-linear drain currents of transistors in PDET circuit 200 when a multi-tone differential signal is applied to the transistors in order to obtain the power of the differential RF signal in accordance with various examples. In an example, PDET circuit 200 corresponds to PDET 130 that was shown and described above with reference to FIG. 1.

As shown in FIGS. 2A and 2B, PDET circuit 200 comprises a differential pair of transistors 202 and 204. In an example, transistors 202 and 204 are N-channel MOSFETs (NMOS). In other examples, P-channel MOSFETs (PMOS) transistors or bipolar junction transistors (BJTs) may be used. In an example, the transistors 202, 204 are coupled together as a differential pair using a common-source configuration. For example, the drain terminals/nodes of transistors 202 and 204 are coupled together and the source terminals of transistors 202 and 204 are coupled together. The source terminals of transistors 202, 204 are coupled to a ground terminal (e.g., ground voltage potential). A load resistor R is coupled in parallel to a capacitor C. In an example, a first end of the resistor R is coupled to a first end of capacitor C, and a second end of the resistor R is coupled to a second end of capacitor C. The first ends of the resistor-capacitor (R-C) coupling are coupled to the drain terminals of the transistors 202, 204, and the second ends of the R-C coupling are coupled to a positive voltage supply VDD. In an example, the R-C coupling is an RC filter that filters (e.g., attenuates) signals with frequencies other than that of the desired RF signal. In an example, the passband of the RC filter may vary to be centered around the center frequency of the desired RF signal and have a bandwidth to filter other frequency tones. Gate-to-source voltage (Vgs) 206 is a small-signal gate-to-source voltage between the gate terminal and the source terminal of transistor 202, and Vgs 208 is a small-signal gate-to-source voltage between the gate terminal and the source terminal of transistor 204. gmVgs 210 is a small-signal linear drain current that flows in transistor 202 and gmVgs 212 is a small-signal linear drain current that flows in transistor 204. In an example, $gm_2Vgs^2$ 214 is a small-signal non-linear drain current that flows in transistor 202, and $gm_2Vgs^2$ 216 is a small-signal non-linear drain current that flows in transistor 204.

In operation, as shown in FIGS. 2A and 2B, the R-C coupling filters small-signal AC signals at the drain terminals of transistors 202, 204. In an example, PDET circuit 200 is biased with DC voltages at the drain terminal and the gate terminal to cause transistors 202, 204 to operate at a DC operating point, although the DC bias connections and components used for DC biasing transistors 202, 204 are not illustrated. A differential multi-tone signal that includes small-signal voltage components are applied to the gate terminals of transistors 202 and 204. In an example, a positive multi-tone signal of a differential pair that includes a small-signal RF component and small-signal interferer RF components is applied to the gate terminal of transistor 202. In an example, a negative multi-tone signal of the differential pair that includes the small-signal RF component and the small-signal interferer RF components are applied to the gate terminal of transistor 204. The positive small-signal multi-tone RF signal and the negative small-signal multi-tone RF signal have equal magnitude and frequency but are out of phase with each other. As discussed above, small-signal transistor operation is analyzed as a series of linear and non-linear voltage and current sources. In an example of small-signal transistor operation, drain current is of transistors 202, 204 can be modeled by $gmVgs+gm_2Vgs^2+gm_3Vgs^3+$higher-order terms. gm is a first-order linear transconductance parameter, $gm_2$ is a second-order non-linear transconductance parameter, $gm_3$ is a third-order non-linear transconductance parameter. In transistors, $gm>gm_2>gm_3$. For discussion purposes, higher-order non-linear transconductance parameters $gm_x$ are not described in detail as they are several orders of magnitude smaller than the second-order non-linear transconductance parameter $gm_2$, for example. However, their application follows that of the first and second-order parameters described.

In an example, the differential signals including the small-signal voltage components at the gate terminals to transistors 202 and 204 are a positive input voltage signal VINP (e.g., A sin(ωt)) supplied from an input node coupled to transistor 202 and a negative input voltage signal VINM (e.g., −A sin(ωt)) at a second input node coupled to transistor 204. In an example, VINP is applied to the gate terminal of transistor 202 and VINM is applied to the gate terminal of transistor 204. In an example, VINP is an input signal from an output of an LNA (e.g., LNA 106 in FIG. 1). VINM is obtained from VINP by applying a phase change to VINP. In an example, VINP is a multi-tone RF signal that includes an interferer RF signal and is out of phase with VINM. PDET circuit 200 rejects odd-order current components and passes even-order components of drain current is to obtain the output voltage VOUTP, as shown and described below.

In operation, and referencing transistors 202 and 204 of FIG. 2A, when VINP is applied to the gate terminal of transistor 202, Vgs 206 causes the primary small-signal linear drain current gmVgs 210 in transistor 202 to flow from the drain terminal to source terminal of transistor 202. Also, when negative input voltage signal VINM (e.g., −A sin(ωt)) is applied to the gate terminal of transistor 204, Vgs 208 of transistor 204 causes the primary small-signal linear drain current gmVgs 212 in transistor 204 to flow from the source terminal to the drain terminal. The small-signal linear drain currents gmvgs 210, 212 are equal but flow in opposite directions between the drain and the source terminals. In an example, small-signal linear drain current gmVgs 210 and small-signal linear drain current gmvgs 212 flow in a loop between transistors 202 and 204 (e.g., flow in a loop between the drain terminals and the source terminals in transistors 202 and 204). These gmVgs 210 and 212 being equal in magnitude but opposite in direction continuously flow in a loop between transistors 202, 204 and do not exit the transistors 202, 204, which causes their net contribution to the output voltage at VOUTP to be zero.

In operation, and referencing FIG. 2B, PDET circuit 200 detects the power of an interferer RF signal using $gm_2Vgs^2$ 214 of transistor 202 and $gm_2Vgs^2$ 216 of transistor 204. In an example, when positive input voltage signal VINP (e.g., A sin(ωt)) is applied to the gate terminal of transistor 202, Vgs 206 of transistor 202 is forward biased (e.g., the gate terminal is positive in relation to the source terminal) and $gm_2Vgs^2$ 214 in transistor 202 flows from the drain terminal to source terminal of transistor 202. Also, when negative input voltage signal VINM (e.g., −A sin(ωt)) is applied to the gate terminal of transistor 204, Vgs 208 of transistor 204 is reverse biased (e.g., gate terminal is negative in relation to source terminal). Further, VINM is the gate-to-source voltage applied (e.g., Vgs) at the gate terminal of transistor 204, $gm_2Vgs^2$ 216 causes a squaring operation of the negative gate-to-source voltage (e.g., squaring −vgs), and causes a positive $gm_2vgs^2$ 216 to flow from the drain terminal to the source terminal of transistor 204. The $gm_2Vgs^2$ 214 and 216 exit the drain nodes of transistors 202, 204 and combine at the drain terminals of transistors 202, 204 as $-2gm_2Vgs^2$. The $gm_2Vgs^2$ 214, 216 that exit the drain terminals into the resistor R are equal to a square of $vgs^2$. The $gm_2Vgs^2$ 214, 216 currents result in a DC current (e.g., $A^2/2$) and AC current $(A^2/2)\cos(2\omega t)$, where A is the amplitude. The DC current passes through resistor R to provide a voltage drop across the resistor R and result in an output voltage VOUTP at the drain terminals of transistors 202, 204. The DC current (e.g., $A^2/2$) provides the power of the interferer RF signal using a voltage-current (V-I) relationship. In an example, the resistor R and capacitor C form an RC filter. The second-order non-linear AC drain current $(A^2/2)\cos(2\omega t)$ is filtered out by the RC filter. Further, in an example, the first-order linear AC drain current gmVgs does not exit the transistors 202, 204, and do not have to be filtered by the RC filter. The impedance at the drain node of transistors 202, 204 is drain-to-source resistance $r_{ds}$ and resistance of resistor R. PDET circuits that use a common-drain configuration result in the second-order non-linear currents exiting the source terminals and combining at the source nodes. At the source terminal for these PDETs, the impedance looking into the source terminal is 1/gm, which is small. The small-signal gain Av is defined as voltage out/voltage in. The output impedance of PDET circuits that use a common-drain configuration is 1/gm in parallel with a load resistor R. Thus, the small-signal gain Av is $(-gm_2/gm)*Vgs^2$. The small-signal source voltage gain Av of PDET circuit 200 (e.g., in a common-source configuration) is a function of a load resistance and $gm_2Vgs^2$. In an example, a load of PDET circuit 200 is resistance of resistor R in parallel with drain-to-source resistance $rd_s$. In an example, the small-signal gain Av of PDET circuit 200 is $-gm_2*Vgs^2*((r_{ds}*R)/(r_{ds}+R))$. As $r_{ds}$ is larger than 1/gm, the small-signal gain of the interferer RF signal in PDET circuit 200 is higher than the small-signal gain in PDET circuits that use a common-drain configuration. In an example, the small-signal gain Av of PDET is around 13 dB higher than conventional PDETs. The higher small-signal gain Av of the PDET can detect weaker interferer RF signals than conventional PDETs without degrading performance measures of an LNA and a mixer in a receiver chain, which improves sensitivity of the PDET over conventional PDETs.

Figure 3:
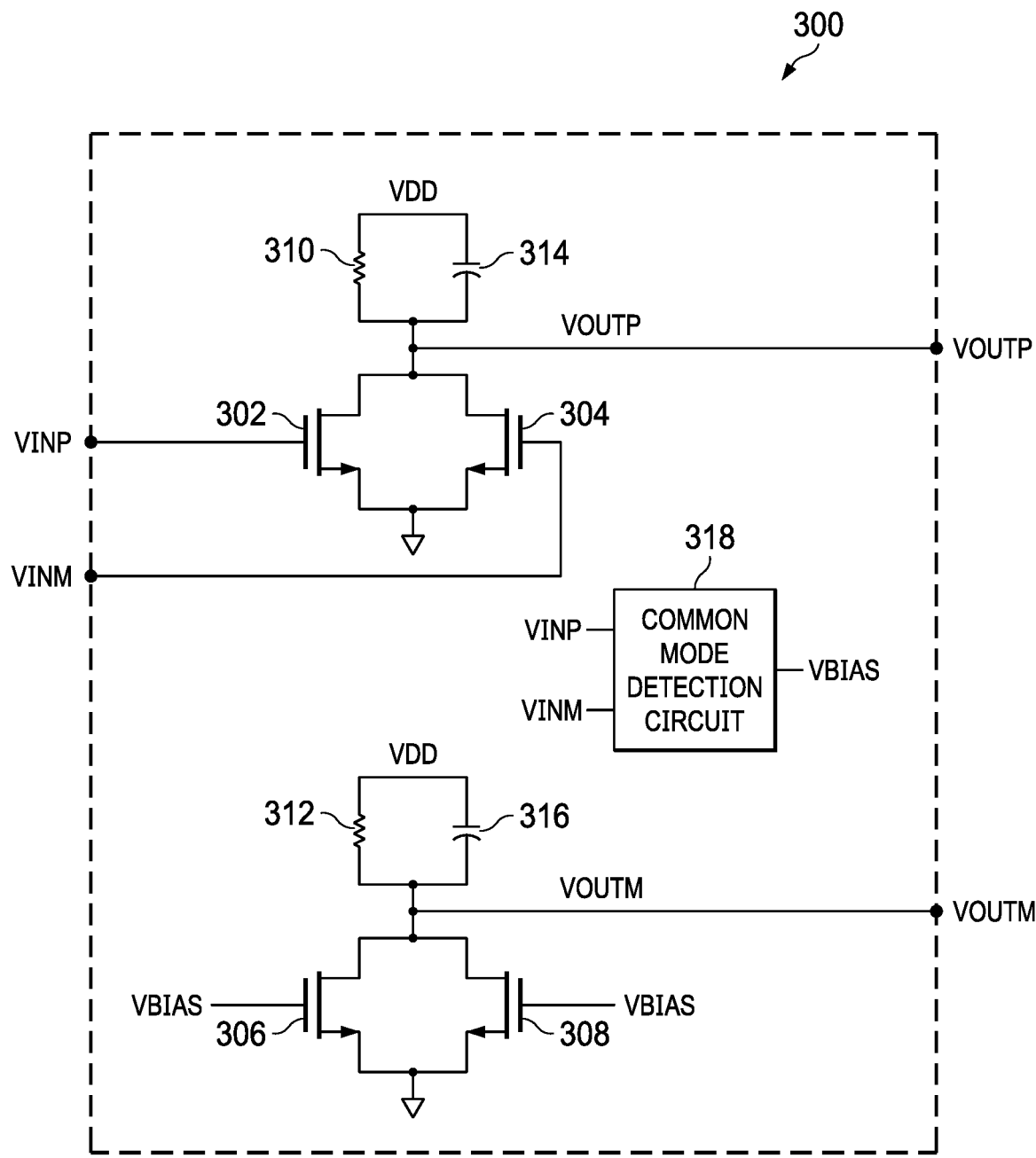
FIG. 3 is a circuit diagram of a peak detector circuit in accordance with various examples.

FIG. 3 is a block diagram of a PDET circuit 300 for detecting strength of an interferer RF signal in accordance with various examples. In an example, PDET circuit 300 corresponds to PDET circuit 130 and includes components that correspond to those of PDET circuit 200 that was shown and described above with reference to FIGS. 1 and 2A-2B. As shown in FIG. 3, PDET 300 includes NMOS transistors 302, 304, 306, and 308, resistors 310 and 312, capacitors 314 and 316, common-mode detection circuit 318, input voltage signal VINP, negative input voltage signal VINM, output voltages VOUTP and VOUTM, and DC bias voltage VBIAS. Input voltage signal VINP includes a small-signal AC signal (e.g., A sin($\omega$t)), and input voltage signal VINM includes a negative small-signal AC signal (e.g., -A sin($\omega$t)). In an example, transistors 302, 304 are coupled together in a common-source configuration. In an example, the drain terminals of transistors 302, 304 are coupled together, the source terminals of transistors 302, 304 are coupled together and to a ground terminal/node (e.g., ground voltage potential), and resistor 310 is coupled in parallel to capacitor 314 (e.g., R-C components). The R-C components 310, 314 are coupled at one end to the drain terminals of the transistors 302, 304, and are coupled at a second end to a positive voltage supply VDD. In an example, transistors 302, 304 are coupled together in a common-source configuration. In an example, the drain terminals of transistors 306, 308 are coupled together, the source terminals of transistors 306, 308 are coupled together and to a ground terminal/node (e.g., ground voltage potential), and resistor 312 is coupled in parallel to capacitor 316 (e.g., R-C components). The R-C components 312, 316 are coupled at one end to the drain terminals of the transistors 306, 308, and are coupled at a second end to a positive voltage supply VDD. Common-mode detection circuit 318 includes input nodes and an output node. In an example, common-mode detection circuit 318 receives input voltage signal VINP at an input node and input voltage signal VINM at another input node. Common-mode detection circuit 318 generates DC bias voltage VBIAS (e.g., DC voltage) as an output voltage using the average value of VINP and VINM (e.g., ½ (VINP+VINM)).

In operation, differential small-signal input voltage signals (e.g., AC signals) are applied to the gate terminals of transistors 302, 304. In an example, input voltage signal VINP is applied to the gate terminal of transistor 302 at a node coupled to the gate terminal of transistor 302, and a negative input voltage signal VINM is applied to the gate terminal of transistor 304 from a node coupled to the gate terminal of transistor 304. In an example, input voltage signal VINP includes an interferer RF signal whose power is being detected. As the input voltage signals VINP, VINM are differential signals, input voltage signal VINP is 180 degrees out of phase with input voltage signal VINM. The input voltage signal VINP at (e.g., Vgs) transistor 302 causes a second-order non-linear drain current $gm_2Vgs^2$ to flow from the drain terminal of transistor 302 to the source terminal of transistor 302. In an example, input voltage signal VINM causes a second-order non-linear drain current $gm_2Vgs^2$ to flow from the drain terminal of transistor 304 to the source terminal of transistor 304. The second-order non-linear drain current $gm_2Vgs^2$ of transistor 302 flows in the same direction (e.g., from the drain terminal to the source terminal of transistor 302) as the second-order non-linear drain current $gm_2Vgs^2$ of transistor 304 (e.g., from the drain terminal to the source terminal of transistor 304). The second-order non-linear drain currents $gm_2Vgs^2$ in transistors 302, 304 are combined at the drain nodes of transistors 302, 304 as $-2gm_2Vgs^2$. As the second-order non-linear drain current $gm_2Vgs^2$ are a square of the input voltage signal VINP (e.g., $(A \sin(\omega t))^2$), and VINM (e.g., $(-A \sin(\omega t))^2$) at the gate terminals, the input voltage signal VINP (e.g., $(A \sin(\omega t))^2$, and VINM (e.g., $(-A \sin(\omega t))^2$ results in a DC (e.g., $A^2/2$) and an AC current $(A^2/2)\cos(2\omega t)$. The DC through load resistor 310 is used to obtain an output voltage VOUTP. The DC is also used to obtain the DC power of the small-signal voltage signals at transistors 302, 304 as V-I. In an example, the AC component $(A^2/2) \cos(2\omega t)$ is filtered out by the R-C components 310, 314.

Common-mode detection circuit 318 operates in a common-mode in order to output a value that is common to the input voltage signals VINP and VINM. In an example, common-mode detection circuit 318 receives the input voltage signals VINP and VINM, and outputs DC bias voltage VBIAS as a DC voltage at an output node of common-mode detection circuit 318. DC bias voltage VBIAS has a value that is common to input voltage signals VINP and VINM. In an example, DC bias voltage VBIAS is an average value of input voltage signals VINP and VINM. In an example, common-mode detection circuit 318 is implemented as a resistor divider circuit that can obtain the average value of input voltage signals VINP and VINM. In an example, DC bias voltage VBIAS is applied to the gate terminals of a differential pair of transistors 306, 308 at nodes coupled to the gate terminals of transistors 306, 308. For example, DC bias voltage VBIAS is applied to an input node coupled to the gate terminal of transistor 306 and DC bias voltage VBIAS is applied to an input node coupled to the gate terminal of transistor 308. DC bias voltage VBIAS biases the gate terminals of transistors 306, 308 and caused the transistors 306, 308 to turn ON and cause a drain current to flow through transistors 306, 308. The voltage drop (e.g., V=IR) across resistor 312 provides the output voltage VOUTM. Capacitor 316 is a decoupling capacitor for the load. The output voltage of PDET 300 is VOUTP and VOUTM, which are analog DC voltages that are sent to comparator 132 (as described above and shown in FIG. 1) that provides a triggering signal to AGC 136 based on the difference between VOUTP and VOUTM that is compared to a threshold voltage at the comparator 132. The difference of VOUTP and VOUTM with the threshold voltage is used to adjust the gain (e.g., increase or decrease the gain) of LNA 106 (as shown in FIG. 1) when receiving the triggering signal in order to operate the LNA 106 in the linear region. In an example, the small-signal gain Av of PDET is around 13 dB higher than conventional PDETs. The higher small-signal gain Av of the PDET can detect weaker interferer RF signals than conventional PDETs without degrading performance measures of an LNA and a mixer in a receiver chain, which improves sensitivity of the PDET over conventional PDETs.

Figure 4:
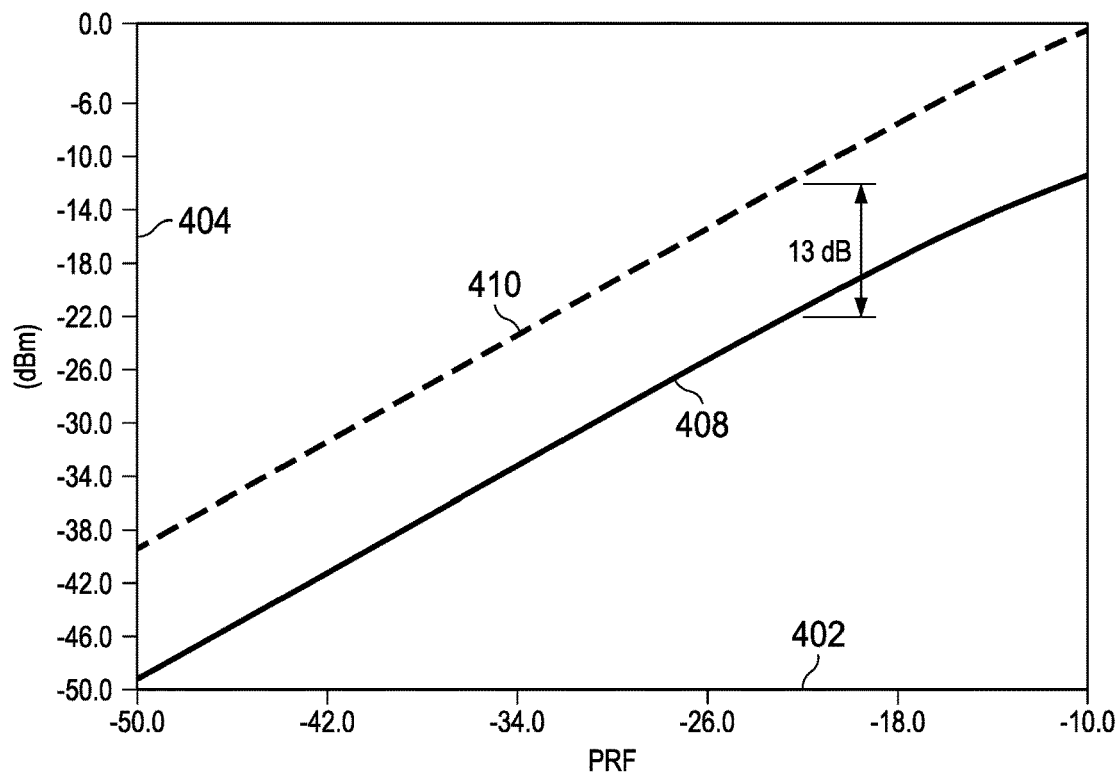
FIG. 4 is a waveform diagram depicting operation of a peak detector circuit in accordance with various examples.
Figure 5:
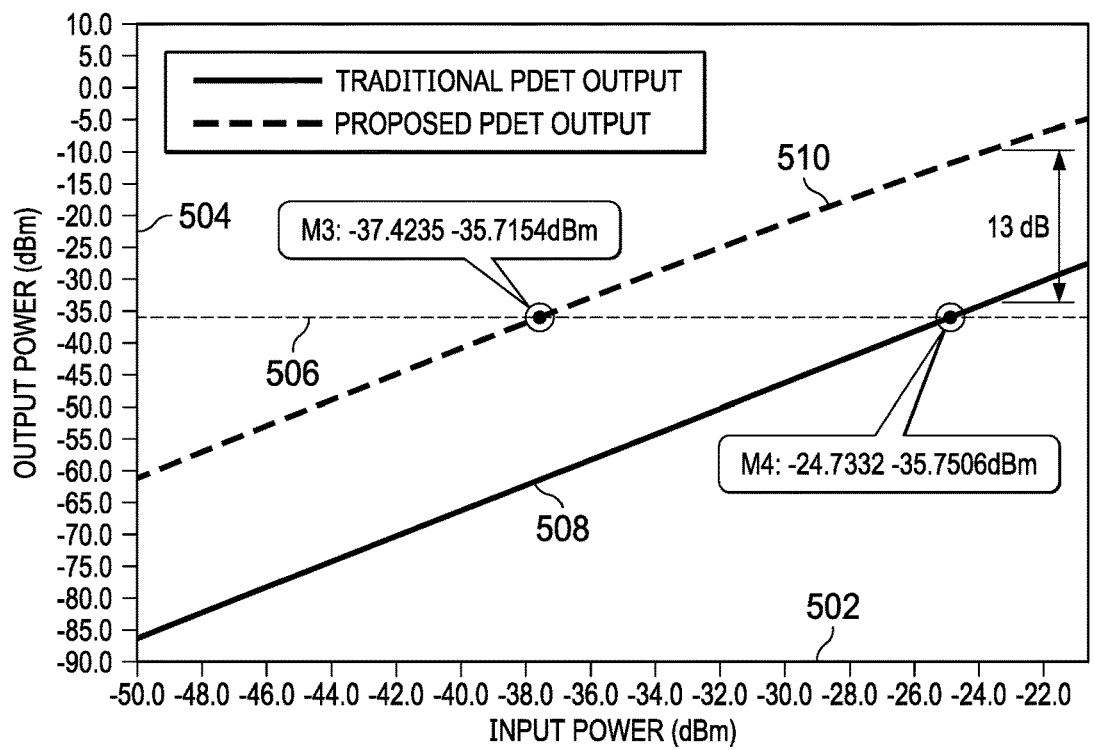
FIG. 5 is a waveform diagram depicting operation of a peak detector circuit in accordance with various examples.

FIGS. 4 and 5 are waveform diagram that illustrate operation of a PDET in accordance with various examples. In an example, the PDET is PDET 130 that was shown and described above with reference to FIG. 1.

Waveform diagram 400 of FIG. 4 includes an x axis 402 as input RF power (e.g., in dBm) of an interferer RF signal (e.g., interferer RF signal 116), a y axis 404 as DC voltage (e.g., in dBm) of an interferer RF signal that is measured at the drain terminals of the PDET (e.g., output voltage VOUTP in FIG. 2B), a DC voltage curve 408 of a comparable PDET, and a DC voltage curve 410 of the PDET described in some examples above (e.g., PDET 130). In operation, the described PDET improves the small-signal voltage gain Av of the PDET by around 13 dB over comparable PDETs by increasing the DC voltage of the interferer RF signal at the output of the PDET. In an example, for a range of −50 dB to −10 dB of RF power of an interferer RF signal, the DC voltage curve 410 of the described PDET is around 13 dB higher than the DC voltage 408 of the comparable PDET, which represents an improved gain Av of the PDET over the comparable PDET.

Waveform diagram 500 of FIG. 5 includes an x axis 502 as input RF power (e.g., in dBm) of an interferer RF signal (e.g., interferer RF signal 116), a y axis 504 as DC voltage (e.g., in dBm) of an interferer RF signal that is measured at the drain terminals of the PDET (e.g., output voltage VOUTP in FIG. 2B), a minimum DC voltage 506 that is input to a comparator (e.g., comparator 132), a DC voltage curve 508 of a comparable PDET, and a DC voltage curve 510 of the PDET described in some examples above (e.g., PDET 130). In an example, the minimum DC voltage 506 is −36 dBm (or 5 millivolt (mV)). In operation, the PDET improves sensitivity of the PDET to detect out-of-band interferer RF signals when compared to comparable PDETs by detecting interferer RF signals at a lower input RF power (e.g., −37 dBm). In an example, the described PDET outputs the minimum DC voltage 506 of −36 dBm when an interferer RF signal with an input RF power of −37 dBm is detected. In an example, the comparable PDET outputs the minimum DC voltage 506 of −36 dBm when an interferer RF signal with an input RF power of −24 dBm is detected. In an example, the described PDET detects a lower input RF power of an interferer RF signal than comparable PDETs, representing an improvement in sensitivity over conventional PDETs by around 13 dB. In an example, when a lower input RF power (e.g., −37 dBm) is detected by the PDET, an AGC (e.g., AGC 136) controls the LNA (e.g., LNA 106 in FIG. 1) to operate in the linear region of operation prior to the LNA saturating, as would occur with comparable PDETs when interferer RF signals at −24 dBm are received.

Figure 6:
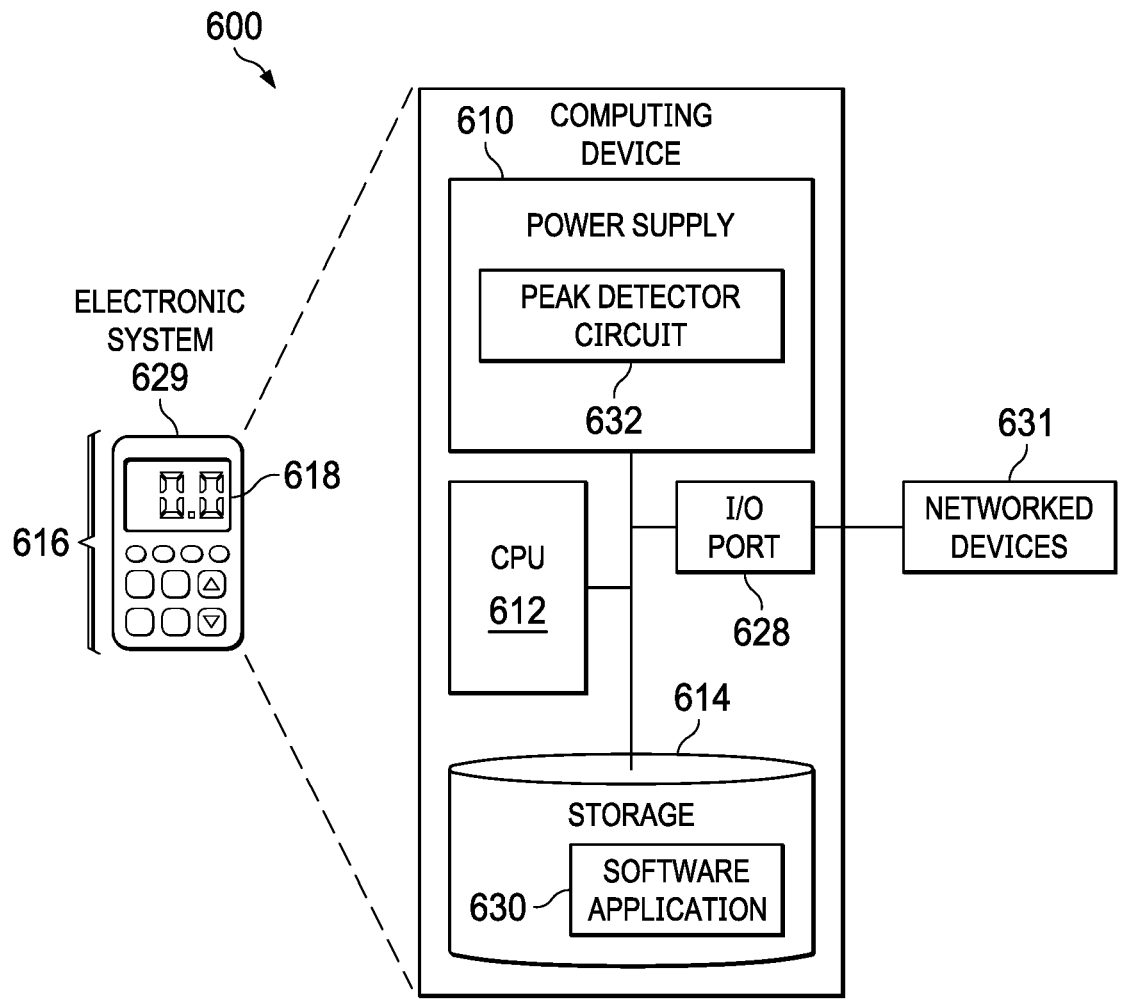
FIG. 6 is a block diagram of a computing device in accordance with various examples.

FIG. 6 is a block diagram of a computing device 600 in accordance with various examples. For example, the computing device 600 is, or is incorporated into, or is coupled (e.g., connected) to an electronic system 629, such as a computer, electronics control "box" or display, communications equipment (including transmitters or receivers), or any type of electronic system operable to process information.

In some examples, computing device 600 comprises a megacell or a system-on-chip (SoC) that includes control logic such as a power supply 610, central processing unit (CPU 612), storage 614 (e.g., a random-access memory (RAM)), user interface 616, display 618, and input-output (I/O) port 628. In examples, CPU 612 is a CISC-type (Complex Instruction Set Computer) CPU, RISC-type CPU (Reduced Instruction Set Computer), MCU-type (Microcontroller Unit), or a digital signal processor (DSP). CPU 612 comprising one or more processors. The one or more processors are arranged to execute code for transforming the one or more processors into a special-purpose machine or improving the functions of other components in computing device 600 to provide a desired output without performing similar operation of the one or more processors. CPU 612 comprises memory and logic that store information frequently accessed from storage 614.

In some examples, storage 614 is memory such as on-processor cache, off-processor cache, RAM, flash memory, or disk storage for storing one or more software applications 630 (e.g., embedded applications). The one or more software applications 630 (e.g., embedded applications), that when executed by CPU 612, perform functions associated with computing device 600 that are described herein.

In an example, a user controls computing device 600 using UI 616. In an example, during execution of software application 630, a user provides inputs to computing device 600 via UI 616, and receives outputs from computing device 600. In examples, the outputs are provided via display 618, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like.

CPU 612 and power supply 610 are coupled to I/O port 628. In an example, I/O port 628 provides an interface that is configured to receive input from (and/or provide output to) networked devices 631. Networked devices 631 can include any device (including test equipment) capable of point-to-point and/or networked communications with computing device 600. Computing device 600 is often coupled to peripherals and/or computing devices, including tangible, non-transitory media (such as flash memory) and/or cabled or wireless media. These and other input and output devices are selectively coupled to the computing device 600 by external devices using wireless or cabled connections. Storage 614 is accessible, for example, by networked devices 631. The CPU 612, storage 614, and power supply 610 are also optionally coupled to an external power supply (not shown), which is configured to receive power from a power source (such as a battery, solar cell, "live" power cord, inductive field, fuel cell, capacitor, and the like).

In an example, power supply 610 is a switched-mode power supply (e.g., "switched converter") that is operable to operate in a discontinuous conduction mode (DCM) or continuous conduction mode (CCM). In examples, power supply 610 is in the same physical assembly as computing device 400, or is coupled to computing device 600. Power supply 610 includes peak detector circuit 632. Although peak detector circuit 632 is illustrated as being included in power supply 610 as a single unit, in examples, various portions of peak detector circuit 632 is included in the same module (e.g., as formed by a die as produced in semiconductor manufacturing) or in different modules. While not shown in FIG. 6, power supply 610 includes power generating components. Power generating components include one or more power switches. Each of the switches is independently controlled for generating power to supply power at various input voltages to various components of computing device 600. Computing device 600 operates in various power-saving modes whereby individual voltages are supplied (and/or turned off) by the power switches in accordance with a selected power-saving mode and the various components arranged within a specific power domain.

In an example, peak detector circuit 632 is operable to operate in power supply 610 in order to regulate a ripple voltage of an output voltage using one or more control loops. Peak detector circuit 432 is operable to detect power of relatively weak interferer RF signals without degrading performance measures of an LNA and a mixer in a receiver chain. In an example, the detected interferer power is provided to an AGC circuit in order to adjust the gain of an LNA and thereby move the LNA operating point from the saturation region to a linear region of operation. In various examples, the teachings disclosed herein can be applied to virtually all communication systems and protocols including WIFI, BLUETOOTH, LTE, or the like.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A system for detecting power of a signal, comprising:
an antenna configured to send a first signal;
an amplifier coupled to the antenna to receive the first signal and configured provide a second signal based on the first signal;
a peak detector coupled to the amplifier, comprising:
a transistor pair, comprising:
a first transistor comprising a first control terminal, a first current terminal, and a second current terminal, the first control terminal configured to receive a first differential component of the second signal; and
a second transistor comprising a second control terminal, a third current terminal, and a fourth current terminal, wherein the third current terminal is coupled to the first current terminal to form an output node of the peak detector, the output node configured to output a third signal, the fourth current terminal is coupled to the second current terminal, and the second control terminal is configured to receive a second differential component of the second signal; and
a parallel resistive-capacitive circuit having a first end coupled to the first current terminal and the third current terminal and having a second end configured to be coupled to a voltage supply; and
an automatic gain-control (AGC) circuit coupled to the output node of the peak detector and to the amplifier, wherein the AGC circuit is configured to provide a gain control signal to the amplifier based on the third signal.

2. The system of claim 1, wherein the parallel resistive-capacitive circuit includes a resistor having a first end and a second end, wherein the first end of the resistor is coupled to the first current terminal and the third current terminal, and wherein the second end of the resistor is configure to be coupled to voltage supply.

3. The system of claim 2, wherein the parallel resistive-capacitive circuit further includes a capacitor coupled to the resistor, wherein a first end of the capacitor is coupled to the first end of the resistor, and wherein a second end of the capacitor is configured to be coupled to the voltage supply.

4. The system of claim 1, further comprising a mixer coupled to the amplifier to receive the second signal and configured to provide a fourth signal based on the second signal.

5. The system of claim 4, further comprising a filter coupled to the mixer to receive the fourth signal and configured to provide a fifth signal based on the fourth signal.

6. The system of claim 5, further comprising an analog-to-digital converter (ADC) coupled to the filter and to the AGC, wherein the ADC is configured to provide a sixth signal to the AGC based on the fifth signal.

7. The system of claim 1, further comprising a comparator coupled to the peak detector to receive the third signal and configured to output a trigger signal based on a comparison of a threshold signal with the third signal.

8. An apparatus, comprising:
a transistor pair, comprising:
a first transistor comprising a first control terminal and a first current terminal, the first control terminal configured to receive a first component of a differential signal; and
a second transistor comprising a second control terminal and a second current terminal coupled to the first current terminal, wherein teh second control terminal is configured to receive a second component of the differential signal, and the second current terminal is coupled to teh first current terminal to form an output node that is configured to output a third signal; and
a parallel resistive-capacitive circuit having a first end coupled to teh first current terminal and teh second current terminal and having a second end configured to be coupled to a voltage supply.

9. The apparatus of claim 8, further comprising a resistor having a first end and a second end, wherein the first end of the resistor is coupled to the first current terminal and the second current terminal, and wherein the second end of the resistor is configured to be coupled to the voltage supply.

10. The apparatus of claim 9, further comprising a capacitor coupled to the resistor, wherein a first end of the capacitor is coupled to the first end of the resistor, and wherein a second end of the capacitor is configured to be coupled to the voltage supply.

11. The apparatus of claim 8, wherein the first component of the differential signal is configured to generate a first current in the first transistor, and wherein the second component of teh differential signal is configured to generate a second current in the second transistor.

12. The apparatus of claim 11, wherein the first current comprises a first DC current signal and a first AC current signal.

13. The apparatus of claim 12, wherein the second current comprises a second DC current signal and a second AC current signal.

14. The apparatus of claim 13, wherein the third signal at the output node is proportional to the first DC current signal and the second DC current signal.

15. A system, comprising:
an antenna configured to send a first signal;
an amplifier coupled to the antenna to receive the first signal and configured provide a second signal based on the first signal, the second signal being a differential signal;
a mixer coupled to the amplifier to receive the second signal and configured to provide a third signal based on the second signal;
a filter coupled to the mixer to receive the third signal and configured to provide a fourth signal based on the third signal;
an analog-to-digital converter (ADC) coupled to the filter and configured to provide a fifth signal based on the fourth signal;
a peak detector coupled to the amplifier to receive the second signal and configured to provide a sixth signal based on the second signal, wherein teh peak detector includes a transistor pair having respective current terminals coupled together, each transistor of teh transistor pair having a control terminal configured to receive a respective component of teh differential signal, the peak detector further including a parallel resistive-capacitive circuit having a first end coupled to the respective current terminals of the transistor pair and a second end configured to be coupled to a voltage supply;
a comparator coupled to the peak detector to receive the sixth signal and configured to output a trigger signal based on a comparison of a threshold signal with the sixth signal; and
an automatic gain-control (AGC) circuit coupled to the comparator and to the amplifier, wherein the AGC circuit is configured to provide a gain control signal to the amplifier based on the trigger signal.

16. The system of claim 15, wherein the transistor pair includes:
a first metal oxide semiconductor field effect transistor (MOSFET) in which the respective control terminal is a first gate terminal, and the respective current terminal is a first drain terminal, the first MOSFET further including a first source terminal; and
a second MOSFET in which the respective control terminal is a second gate terminal, and teh respective current terminal is a second drain terminal, teh second MOSFET further including a second source terminal, wherein the second drain terminal is coupled to the first drain terminal, and the second source terminal is coupled to the first source terminal;
the peak detector further comprising:
a first input node formed by the first gate terminal;
a second input node formed by the second gate terminal; and
an output node formed by the first drain terminal and the second drain terminal and configured to output the sixth signal that is proportional to a power of the first signal and the second signal.

17. The system of claim 16, wherein the parallel resistive-capacitive circuit includes a resistor having a first end and a second end, wherein the first end of the resistor is coupled to the first drain terminal and the second drain terminal, and wherein the second end of the resistor is configured to be coupled to the voltage supply.

18. The system of claim 17, wherein the resistive-capacitive circuit further includes a capacitor, wherein a first end of the capacitor is coupled to the first end of the resistor, and wherein a second end of the capacitor is configured to be coupled to the voltage supply.

19. The system of claim 16, wherein the second signal is configured to generate a first drain current in the first MOSFET, and generate a second drain current in the second MOSFET.

20. The system of claim 19, wherein the first drain current comprises a first DC current signal and a first AC current signal, and wherein the second drain current comprises a second DC current signal and a second AC current signal.

\* \* \* \* \*